United States Patent
Yanase et al.

(10) Patent No.: US 7,215,611 B2
(45) Date of Patent: May 8, 2007

(54) COMPRESSED AUDIO DATA EDITING METHOD AND APPARATUS

(75) Inventors: Katsuhiko Yanase, Iruma (JP); Akira Suzuki, Nishitokyo (JP); Eiji Ueda, Kodaira (JP)

(73) Assignee: TEAC Corporation (JP)

( * ) Notice: Subject to any disclaimer, the term of this patent is extended or adjusted under 35 U.S.C. 154(b) by 307 days.

(21) Appl. No.: 10/439,647

(22) Filed: May 16, 2003

(65) Prior Publication Data

US 2003/0216924 A1    Nov. 20, 2003

(30) Foreign Application Priority Data

May 20, 2002   (JP)   ............................. 2002-144188

(51) Int. Cl.
*G11B 27/00* (2006.01)
(52) U.S. Cl. ..................................... 369/47.13; 369/83
(58) Field of Classification Search ................. 369/83, 369/84, 30.09, 30.25, 30.3, 47.13, 47.23, 369/53.37, 59.21, 124.06, 124.07, 44.24, 369/59.13, 59.23, 124.08, 47.16, 47.24, 275.3, 369/47.21, 47.3, 53.36, 59.14; 704/500, 704/219; 713/193; 386/95
See application file for complete search history.

(56) References Cited

U.S. PATENT DOCUMENTS

| | | | | |
|---|---|---|---|---|
| 5,490,130 A | * | 2/1996 | Akagiri | ................. 369/124.08 |
| 5,546,368 A | * | 8/1996 | Lee et al. | ................. 369/47.23 |
| 5,761,173 A | * | 6/1998 | Inoue | ............................ 369/83 |
| 5,995,471 A | * | 11/1999 | Saoyama et al. | ......... 369/47.13 |
| 6,088,304 A | * | 7/2000 | Aramaki et al. | ......... 369/30.09 |
| 6,377,530 B1 | * | 4/2002 | Burrows | ................... 369/59.21 |
| 6,445,654 B1 | * | 9/2002 | Hayakawa et al. | ...... 369/47.23 |
| 6,463,410 B1 | * | 10/2002 | Fuchigami et al. | ......... 704/219 |
| 6,647,496 B1 | * | 11/2003 | Tagawa et al. | ............. 713/193 |
| 6,721,710 B1 | * | 4/2004 | Lueck et al. | ................ 704/500 |
| 6,795,383 B1 | * | 9/2004 | Yamamoto et al. | ...... 369/47.16 |

FOREIGN PATENT DOCUMENTS

| JP | 2000/268539 | 9/2000 |
|---|---|---|
| WO | WO 90/13182 | 11/1990 |

* cited by examiner

*Primary Examiner*—Thang V. Tran
*Assistant Examiner*—Kim-Kwok Chu
(74) *Attorney, Agent, or Firm*—Woodcock Washburn LLP (57) ABSTRACT

A digital recording system for stereophonic audio signals is disclosed. Included is an MP3 encoder coupled to an ADC for encoding the two channels of digital audio signals into a compressed data stream. Before being directed into a flash memory for editing, the compressed data stream is split into the original two channels of audio data blocks. An editing device is coupled to the flash memory for block-by-block editing of the stored audio data blocks. On being subsequently retrieved from the flash memory, the two channels of audio data blocks are reformatted into an MP3 data stream preparatory to introduction into an MP3 decoder.

11 Claims, 9 Drawing Sheets

COMPRESSED AUDIO DATA EDITING METHOD AND APPARATUS

BACKGROUND OF THE INVENTION

This invention belongs to the broad realm of information technology and pertains more particularly to a method of, and apparatus for, editing or rewriting data such as, typically, compressed audio data with little or no adverse effect upon the sound quality.

A variety of data compression techniques have been suggested, and some of them have won more or less widespread commercial acceptance, among such commercially accepted ones being Moving Picture Coding Experts Group's MPEG-3 or, more simply, MP3. Patent Cooperation Treaty Publication No. WO90/13182 is hereby cited as describing how to create MP3-encoded data streams by the Huffman code. The MP3 data stream takes the form of a repetition of frames each constituted of a header section, a side data section, and a main data section.

Difficulties have been encountered with the MP3 encoding of digitized audio data. MP3 encoders on the market today are inherently capable of creating data streams at 320 kilobits per second (kbps) at a maximum, but now commonly put to use at a deplorably lower rate of 128 kbps. The maximum possible bit rate was determined because digital audio frames and MP3 frames agree in time at that rate; that is, the complete audio data in each audio frame could be contained in one MP3 frame if the audio data were MP3 encoded at the maximum bit rate. But then storage media of inordinately large capacities were required for storing the MP3-encoded audio data. Hence the currently preferred MP3 encoder bit rate of 128 kbps.

The MP3 encoding of audio data at this low bit rate had its own weaknesses, however. Depending upon the bit number, the data from each audio frame was rearranged not necessarily just in one MP3 frame but over two or three consecutive ones at that low bit rate, so that the audio data was not wholly rewritable or editable in the form of the MP3 data stream. Conventionally, this difficulty was literally circumvented by converting the MP3 encoded audio data into the known WAVE file format. After being edited in that format, the data was reconverted back into the MP3 format. The audio data that was conventionally processed in this manner inevitably suffered losses in sound quality for conversion from MP3 to WAVE format and reconversion from WAVE to MP3 format.

SUMMARY OF THE INVENTION

The present invention has it as an object to make possible the editing of audio or like data that has been encoded by MP3 or like data compression methods, without the above described inconveniences encountered heretofore.

Briefly stated in one aspect thereof, the present invention provides a data processing method such that the main data to be recorded and possibly edited is first transferred in the form of a compressed data stream constituted of a series of fixed-length frames. Each frame has a main data section and a subdata section. The main data sections of the successive frames are closely packed with variable-length blocks of the main data, with each main data block contained in at least one main data section and possibly spanning the main data sections of a plurality of consecutive frames. The subdata sections hold subdata indicative of the positions of the main data blocks with respect to the frames.

Before storing the main data on a rewritable or editable storage device such as a flash memory, there is created, on the basis of the subdata on the subdata sections of the compressed data stream, control data indicative of the addresses of expected storage locations on the rewritable storage device where the main data blocks on the main data sections of the compressed data stream are to be stored. Then the main data blocks are stored in the expected storage locations on the rewritable storage device, together with the control data to permit the main data blocks on the rewritable storage device to be individually addressed for editing.

Thus, thanks to the control data, all the stored main data blocks are individually addressable for block-by-block editing. Then the possibly edited main data blocks are read out from the rewritable storage device and reformatted preparatory to decoding.

In the preferred embodiment of the invention to be disclosed subsequently, the invention is applied to the recording, editing, and playback of stereophonic audio signals. The two channels of audio signals are first pulse-code-modulated and then MP3-encoded into a compressed audio data stream. The compressed audio data stream is such that the main data sections of the successive frames are closely packed with variable-length blocks of audio data. The subdata sections hold subdata indicative of the positions of the audio data blocks with respect to the frames.

Before being stored on the flash memory, the audio data blocks of the compressed data stream are separated into the original two channels of audio data blocks. At the same time there is also created, the basis of the subdata on the subdata sections of the compressed data stream, control data indicative of the addresses of expected storage locations on the flash memory where the two channels of audio data blocks are to be stored. Then the two channels of audio data blocks are stored in the expected storage locations on the flash memory, and the control data is also stored, either on the same memory or on some other storage device.

After possible block-by-block editing, the two channels of audio data blocks are read out from the memory and reformatted into a single data stream. This data stream has frames of a greater bit number than those of the MP3-encoded data stream, such that the retrieved audio data blocks are contained one in each frame. The audio data blocks of this modified MP3 data stream are decodable, by a known MP3 decoder, into two channels of analog audio signals.

The reader's attention is invited to the fact that although the variable-length audio data blocks are closely packed in the main data sections of the frames in the compressed audio data stream, with each block possibly spanning two or three frames, they are stored separately in the individually addressable storage locations on the memory. The thus-stored audio data blocks are easy of editing block by block. No conversion from MP3 to WAVE format, and the other way around, is required, so that the audio signals processed according to the invention is totally free from deterioration in sound quality.

Preferably, following recovery from the memory, the audio data blocks may be reformatted into a data stream such that the audio blocks are each wholly contained in one main data section. This data stream will then be translated into analog audio signals using a commercially available decoder.

The above and other objects, features and advantages of this invention will become more apparent, and the invention

DESCRIPTION OF THE PREFERRED EMBODIMENTS

Figure 1:
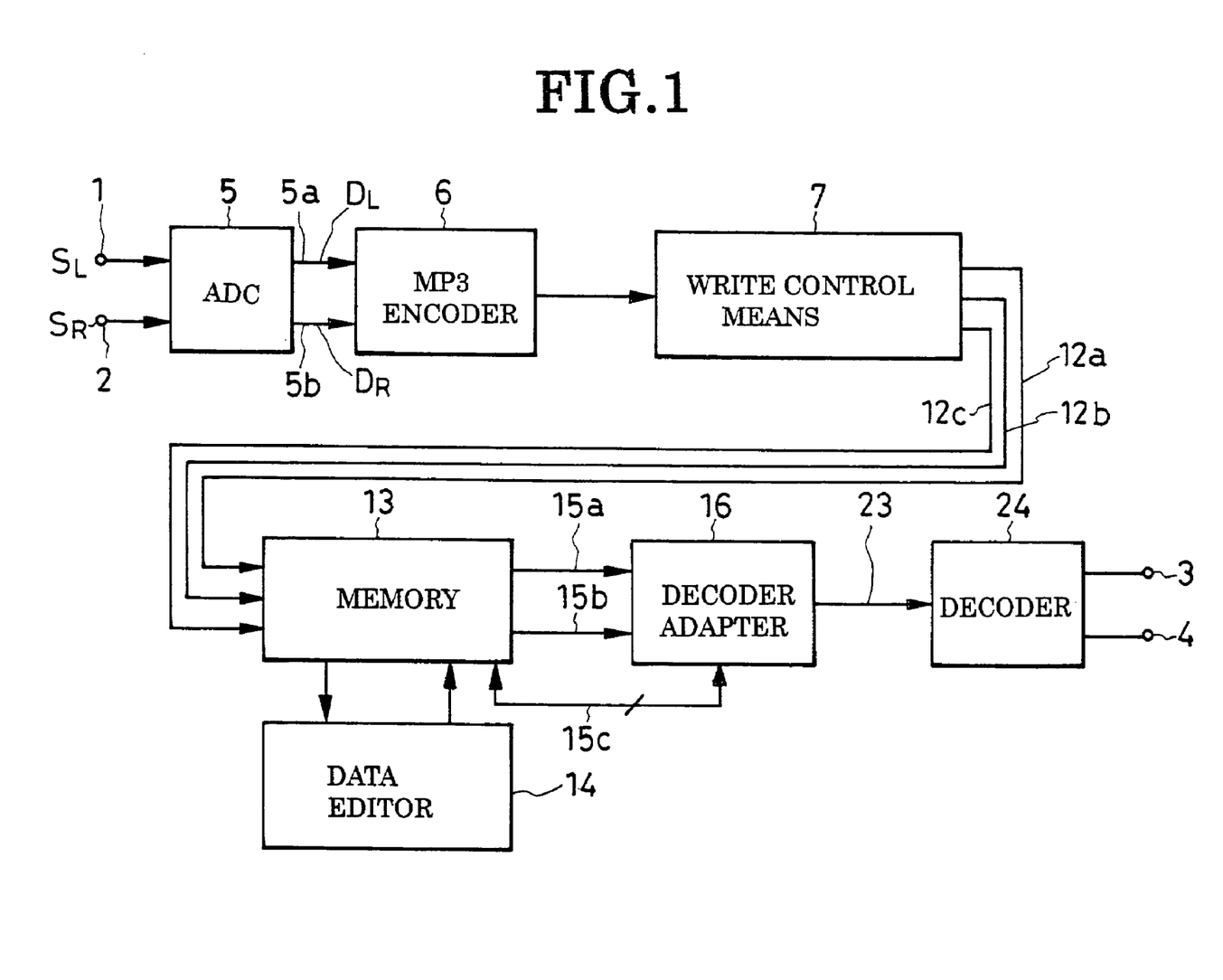
FIG. 1 is a block diagram of a digital audio recorder/player constructed in accordance with the novel concepts of this invention.

The present invention will now be described more specifically in terms of the audio recorder/player shown in FIGS. 1–3 of the above drawings by way of a preferred embodiment of the invention. With reference first to FIG. 1 the representative recorder/player has a pair of input terminals 1 and 2 and a pair of output terminals 3 and 4 for the recording and playback of stereophonic analog audio signals $S_L$ and $S_R$ shown respectively at (A) and (B) in FIG. 4. The input terminals 1 and 2 are to be connected to a pair of microphones, not shown, or like sources of analog signals to be recorded.

Figure 4:
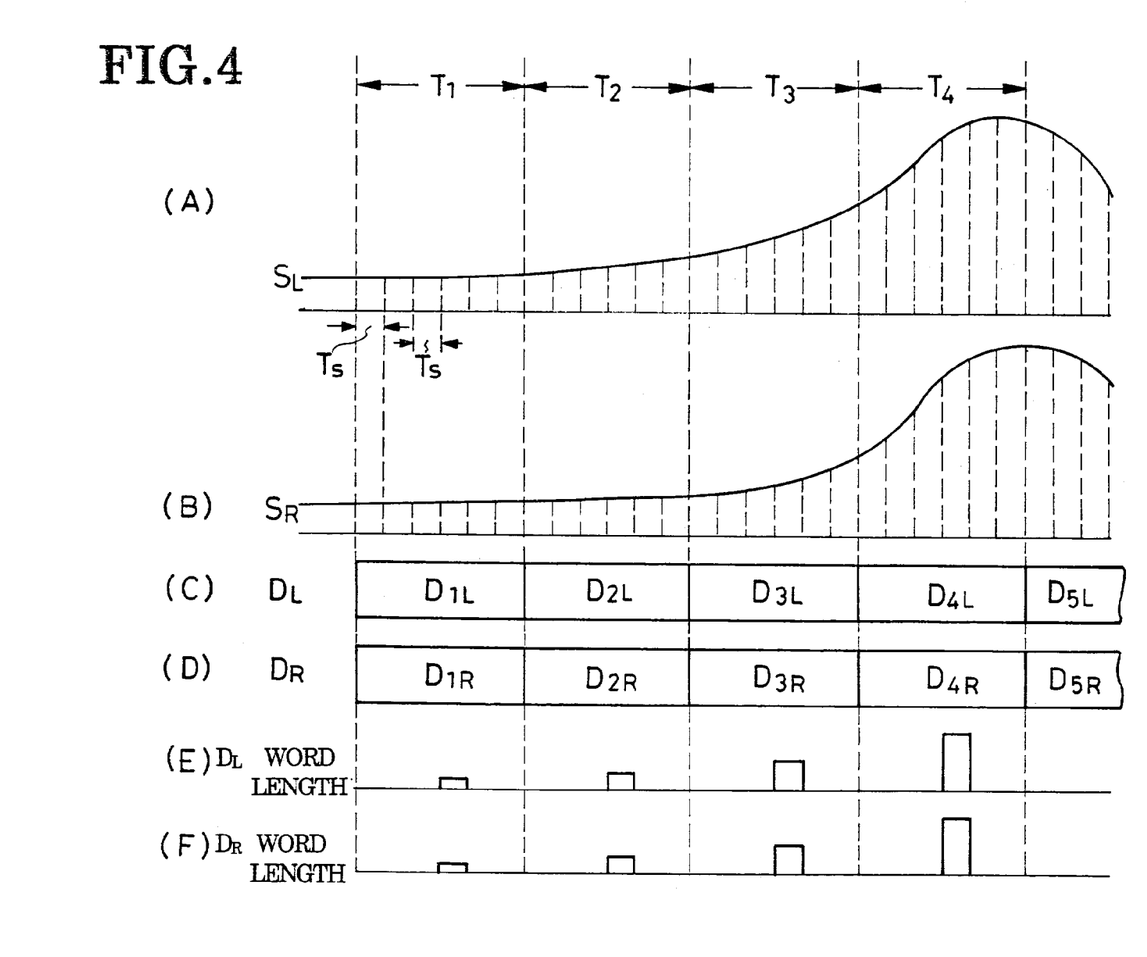
FIG. 4, consisting of (A) through (F), is a series of analog and digital signal diagrams useful in explaining the operation of the analog-to-digital converter included in the FIG. 1 recorder/player.

Connected to the input terminals 1 and 2, an analog-to-digital converter 5 translates the incoming analog audio signals $S_L$ and $S_R$ into pulse-code-modulated digital data streams $D_L$ and $D_R$ indicated at (C) and (D) in FIG. 4. Typically, the analog audio signals $S_L$ and $S_R$ are sampled at 44.1 kilohertz, with the sampling periods $T_s$ indicated by the broken lines at (A) and (B) in FIG. 4. At (C) and (D) in FIG. 4 are the PCM audio data streams shown divided into left-channel data blocks $D_{1L}, D_{2L}, D_{3L}, \ldots$ and right-channel data blocks $D_{1R}, D_{2R}, D_{3R}, \ldots$, which correspond to the audio blocks or frames $T_1, T_2, T_3, \ldots$ each comprised of a prescribed number (e.g. 1152) of samples. The left-channel data blocks $D_{1L}, D_{2L}, D_{3L}, \ldots$ and right-channel data blocks $D_{1R}, D_{2R}, D_{3R}, \ldots$ have the same length each other. As is well known, each PCM data sample, or word, consists of a prescribed number of bits. It is understood that each frame of the PCM data streams includes the familiar subcode or index region carrying self-identificatory data.

The ADC 5 connected to an MP3 encoder 6 as a source of the compressed data stream or means for transferring the compressed data stream. The ADC 5 delivers the PCM data streams to an MP3 encoder 6 over transmission paths $5_a$ and $5_b$. Itself of conventional design, the MP3 encoder 6 combines and compresses the incoming PCM data streams into a single MP3-encoded data stream indicated in FIGS. 5 and 6. The MP3 data stream takes the form of a series of frames $F_1, F_2, F_3, \ldots$ of the same length (e.g. 26 milliseconds). Therefore, the compressed data stream comprises a series of fixed-length frames. In practice each frame may consist of 3336 bits, as indicated at (A) in FIG. 5, or 3344 bits. The sampling frequency may be 44.1 kHz, and the bit rate 128 kbps.

Figure 5:
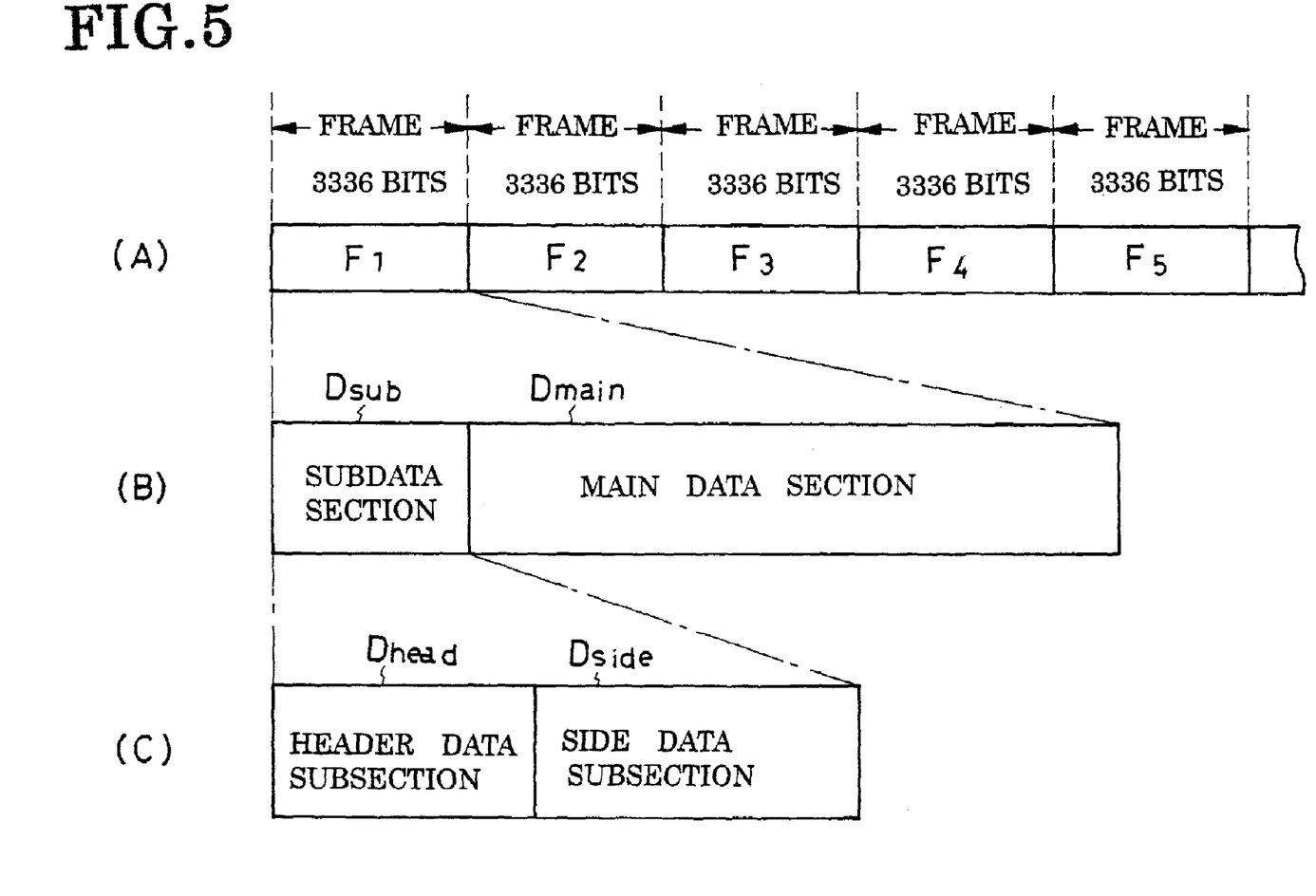
FIG. 5, consisting of (A) through (C), is a series of diagrams explanatory of the configurations of the audio data stream that has been encoded by the MP3 encoder used in the FIG. 1 recorder/player.

Each frame of the MP3 data stream shown at (A) in FIG. 5 is broadly constituted of a main data section $D_{main}$ and subdata section $D_{sub}$ as at (B) in the same figure, in addition to a cyclic redundancy check section and ancillary data section which are not shown by reason of their impertinence to the instant invention. The main data section $D_{main}$ carries the MP3 equivalent of the PCM audio data streams shown at (C) and (D) in FIG. 4.

The subdata section $D_{sub}$ is subdivided into a header data subsection $D_{head}$ and a side data subsection $D_{side}$, as at (C) in FIG. 5. The header data subsection $D_{head}$, thirty-two bits long, carries the 12-bit synchronization word (twelve consecutive logical 1 s) and other information descriptive of the properties of the data stream. The side data subsection $D_{side}$, 256 bits long, includes a nine-bit region for holding data indicative of the beginning of the associated main data block, and other regions for holding data indicative of the length of the associated main data block, the lengths of the data elements contained the associated main data block, and the parameters of the data compression. In short the side data subsection $D_{side}$ carries information indicative of the positions of the associated main data block and data contained therein.

As has been stated in the Background of the Invention, an MP3 encoding of the audio data stream at a bit rate less than 320 kbps result in the creation of an MPS data stream having a different relationship between frames and main data blocks from that in the original audio data stream. The main data that has been contained in one frame of the audio data stream may spill over into the preceding one—a phenomenon known as the bit reservoir. This phenomenon occurs by use of what is known as a variable-word-length code for data compression. Words are not constant in length, or in the number of their constituent bits, in variable-word-length codes: The higher the word is in the probability of appearance, the less is its length, and vice versa.

At (E) and (F) in FIG. 4 are indicated, in terms of bars, the lengths of typical words belonging to the frames $T_1$–$T_4$ of the analog stereophonic audio input signals $S_L$ and $S_R$ at (A) and (B) in FIG. 4. The words lengths are shorter in the frames $T_1$, $T_2$ and $T_3$ than in the frame $T_4$ because the signal amplitude is lower, and the probabilities of word appearance higher, in the first three frames than in the fourth.

The digitized audio signals $D_L$ and $D_R$ are MP3 encoded by the Huffman code, a typical example of variable-word-length codes, in this embodiment of the invention. The Huffman-coded MP3 data stream is such that the words lengths are particularly short in the frames $T_1$ and $T_2$ in FIG. 4 because of the high probabilities of word appearance. The total numbers of bits of such words are less than those of the words belonging to the other frames. MP3 takes advantage of the blanks thus created by permitting the main data of each frame to overflow into a blank, if any, in the preceding frame or frames for a higher rate of data compression. Thus any main data block with a large numbers of total word bits, which has originally been contained in one PCM data frame such as the frame $T_4$ in FIG. 4, may be arranged in more than one MP3 data frame. Each main data block may overflow into up to two preceding MP3 data frames if the sampling frequency of the MP3 encoder 6 is 44.1 kHz, and the data transfer rate 128 kbps/stereo.

Any main data block that has been contained in one PCM data frame but which has been rearranged to span two or three MP3 data frames must be identified by some positional information for proper reproduction. This requirement is met in this embodiment of the invention by writing data indicative of the beginnings and locations of the main data blocks in the side data subsections $D_{side}$, FIG. 5(C), of the MP3 data frames, as set forth in more detail hereinbelow.

The main data block from any arbitrary PCM data frame is never positioned later than the corresponding MP3 data frame. Consequently, if the main data block beginning data on the side data subsection $D_{side}$ of any MP3 data frame is zero, it follows that the corresponding main data block is arranged on the main data section $D_{main}$ immediately following that side data subsection. The main data block beginning data on the side data subsection $D_{side}$ of the first frame of the MP3 data stream is therefore invariably zero.

Figure 6:
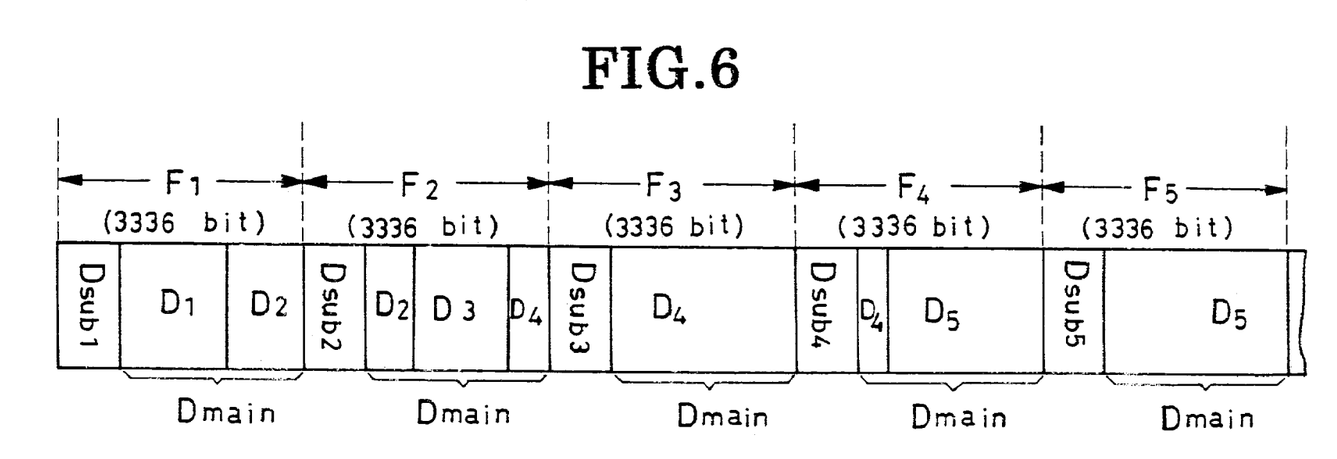
FIG. 6 is a diagram explanatory of how the audio data blocks are closely packed in the main data sections of the MP3-encoded data stream.

FIG. 6 is a somewhat more detailed representation of the MP3 data stream explanatory of how the main data blocks are arranged on its main data sections. The MP3 data stream is shown here as five consecutive frames $F_1$–$F_5$ each consisting of 3336 bits and each comprising a 3048-bit main data section $D_{main}$ and a subdata section $D_{Sub1}$–$D_{sub5}$. Five main data blocks $D_1$–$D_5$ of different bit numbers are shown closely packed in as many consecutive main data sections $D_{main}$. These five main data blocks $D_1$–$D_5$ are equivalent to the combinations of the left- and right-channel data blocks $D_{1L}$ and $D_{1R}$, $D_{2L}$ and $D_{2R}$, $D_{3L}$ and $D_{3R}$, $D_{4L}$ and $D_{4R}$, and $D_{5L}$ and $D_{5R}$, respectively, of the two channels of PCM data streams DL and DR indicated at (C) and (D) in FIG. 4.

However, since the main data blocks $D_1$–$D_5$ have been MP3 compressed, no one-to-one bit correspondence exists between the PCM and MP3 data. The MP3-encoded main data blocks of the left channel will therefore be identified by the reference indicia $D_{ML1}$, $D_{ML2}$, $D_{ML3}$, $D_{ML4}$ and $D_{ML5}$, and those of the right channel by the reference indicia $D_{MR1}$, $D_{MR2}$, $D_{MR3}$, $D_{MR4}$ and $D_{MR5}$, respectively.

Referring more specifically to FIG. 6, being less in bit number than each main data section $D_{main}$, the first main data block $D_1$ occupies only part of the main data section of the first frame $F_1$. The rest of this first main data section $D_{main}$ is filled by part of the second main data block $D_2$, the remaining part of which is contained in the main data section $D_{main}$ of the second frame $F_2$. Although the second main data block $D_2$ extends across the two consecutive frames $F_1$ and $F_2$, the beginning of this second main data block is recognizable from its positional information contained in the second subdata section $D_{sub2}$.

The second frame $F_2$ is itself shown not filled by the second main data block $D_2$ alone but additionally by the whole of the third main data block $D_3$ and part of the fourth main data block $D_4$. The third frame $F_3$ is shown filled up solely by part of the rest of the fourth main data block $D_4$. The fourth frame $F_4$ is shown containing the remainder of the fourth main data block $D_4$ and part of the fifth main data block $D_5$. Thus the fourth main data block $D_4$ spans the maximum of three frames. The fifth frame $F_5$ is shown containing the rest of the fifth main data block $D_5$.

The subdata sections $D_{sub1}$–$D_{sub5}$ of the MP3 data stream shown in FIG. 6 carry the noted main data block beginning data indicative of the beginnings (i.e. subdata sections $D_{sub}$) of the main data blocks $D_1$–$D_5$ with respect to the frames $F_1$–$F_5$ of the MP3 data stream. Preferably, the man data block beginning data may be either "0," "1," or "2." More specifically, the main data block beginning data on any of the subdata sections $D_{sub1}$–$D_{sub5}$ may be "0" if the beginning of the main data block is on the same frame as that subdata section, "1" if the beginning of the main data block is on the first preceding frame, and "2" if the beginning of the main data block is on the second preceding frame. Thus, according to the example represented in FIG. 6, the main data block beginning data on the first to fifth subdata sections $D_{sub1}$–$D_{sub5}$ of the MP3 data stream will be "0," "1," "1," "2" and "1," respectively.

It will be appreciated that bits are increased where data importance is high, and decreased where it is low, according to the MP3 data compression as depicted in FIG. 6. High fidelity audio recording and playback are therefore possible with a minimum of storage capacity requirement.

With reference back to FIG. 1 the MP3 encoder 6 is connected via write control means 7 to a memory 13. The write control means 7 is designed, functionally, to cause the MP3 data stream of FIG. 6 to be written on the memory 13 so as to permit editing despite the absence of one-to-one correspondence between the main data blocks $D_1$, $D_2$, $D_3$, ... and the MP3 data stream frames $F_1$, $F_2$, $F_3$, ... In practice the write control means 7 can be of one-piece construction with the memory 13 but is here shown as a discrete unit coupled to the memory by way of three signal paths $12_a$, $12_b$ and $12_c$.

Figure 2:
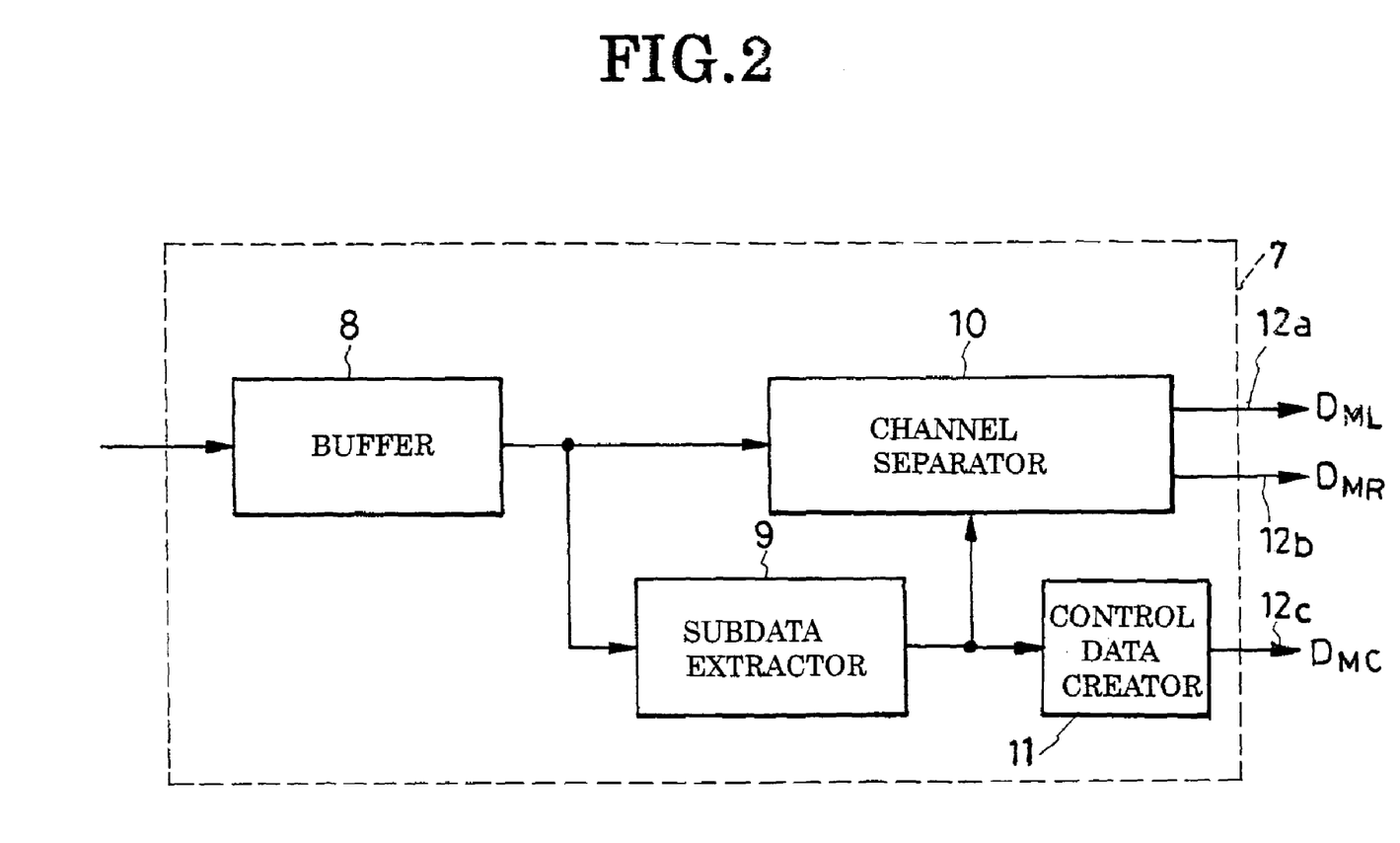
FIG. 2 is a block diagram of the write control means included in the FIG. 1 recorder/player.

As illustrated in more detail in FIG. 2, the write control means 7 includes a buffer 8 connected directly to the MP3 encoder 6, FIG. 1, for buffering the MP3 data stream. Connected to the output of the buffer 8 is a subdata extractor 9 which, as the name implies, derives the subdata from the subdata sections $D_{sub1}$, $D_{sub2}$, $D_{sub3}$, ..., FIG. 6, of the MP3 data stream. The extracted subdata is sent to both channel separator 10 and control data creator 11. The channel separator 10 has another input connected directly to the buffer 8.

Inputting the main data blocks $D_1$, $D_2$, $D_3$, ... in the form of the MP3 encoded data stream of FIG. 6, the channel separator 10 separates them into a series of MP3-encoded left-channel data blocks $D_{ML1}$, $D_{ML2}$, $D_{ML3}$, ... and a series of MP3-encoded right-channel data blocks $D_{MR1}$, $D_{MR2}$, $D_{MR3}$, ..., both for delivery to the memory 13 over the paths $12a$ and $12_b$. The MP3-encoded left-channel data blocks $D_{ML1}$, $D_{ML2}$, $D_{ML3}$, ... correspond to the left-channel PCM data blocks $D_{1L}$, $D_{2L}$, $D_{3L}$, ... of FIG. 4(C), and the MP3-encoded right-channel data blocks $D_{MR1}$, $D_{MR2}$, $D_{MR3}$, ... to the right-channel PCM data blocks $D_{1R}$, $D_{2R}$, $D_{3R}$, ... of FIG. 4(D). The separation of the main data into the two channels is conventionally possible by utilizing the positional information on the side data subsections $D_{side}$, FIG. 5(C), from the subdata extractor 9.

The control data creator 11 also utilizes the subdata from the subdata extractor 9, creating control data $D_{MC}$ indicative of expected addresses in the memory 13 where the main data blocks $D_{ML}$ and $D_{MR}$ of both channels are to be stored. The control data $D_{MC}$ is sent over the path $12_c$ to the memory 13.

The memory 13 may take the form of a flash memory in practice. Itself conventional in the art, the flash memory is a type of semiconductor memory such that the data stored thereon is selectively rewritable or editable. As drawn diagrammatically in FIG. 7, the memory 13 has a first region $M_L$ for storage of the MP3-encoded left-channel main data blocks $D_{ML1}$, $D_{ML2}$, $D_{ML3}$, ..., a second region $M_R$ for storage of the MP3-encoded right-channel main data blocks $D_{MR1}$, $D_{MR2}$, $D_{MR3}$, ..., and a third region $M_C$ for storage of the control data $D_{MC}$. This memory may be constructed for additional storage of additional channels of main data blocks together with their associated control data in cases where the invention is applied to multichannel audio recording and reproduction.

Figure 7:
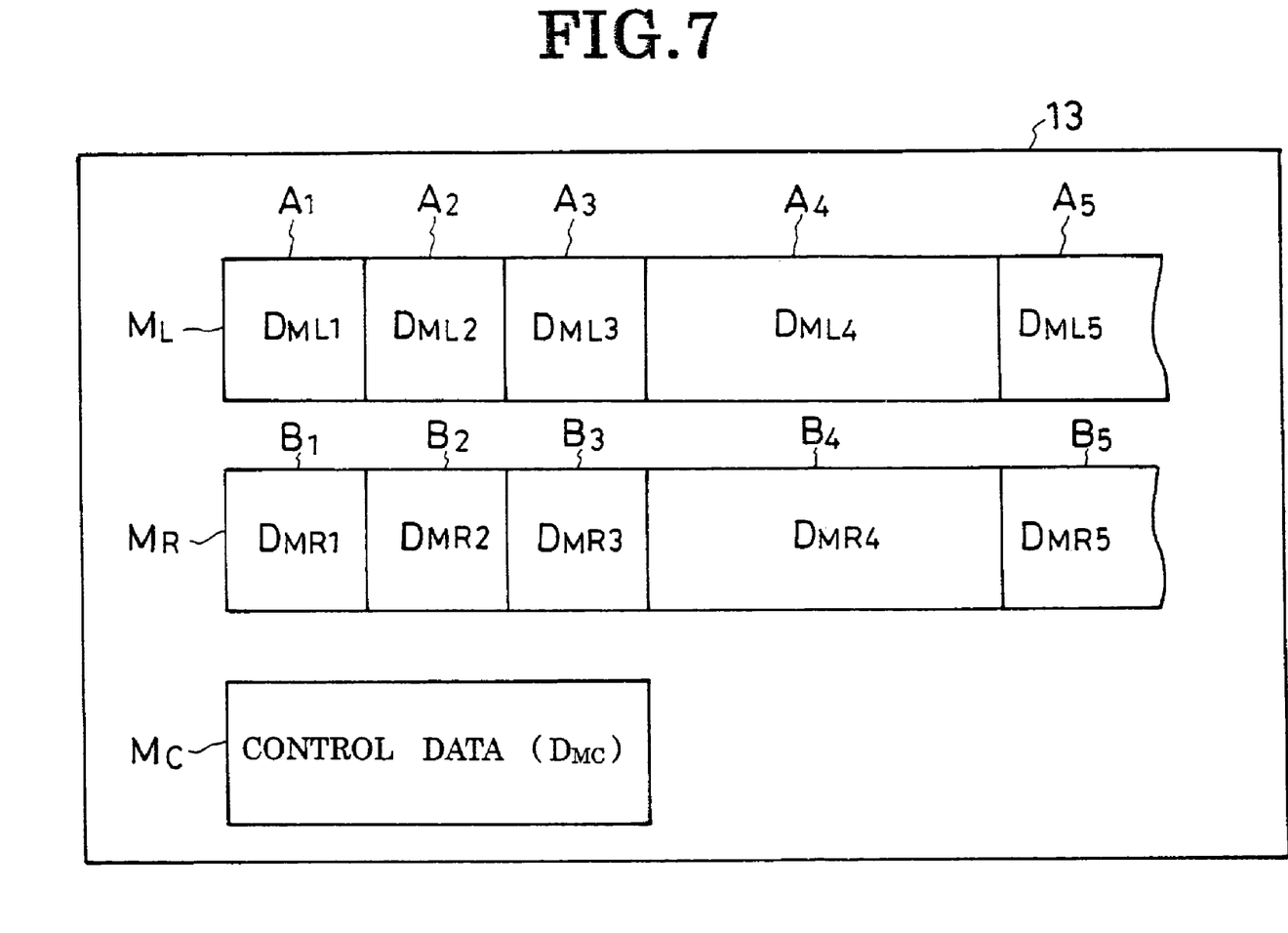
FIG. 7 is a diagram explanatory of how the audio and control data are stored on the memory of the FIG. 1 recorder/player.

FIG. 7 shows by way of example only the first five storage locations, with addresses $A_1$–$A_5$, of the first region $M_L$ for sequential storage of the left-channel main data blocks $D_{ML1}$–$D_{ML5}$, and the first five storage locations, with addresses $B_1$–$B_5$, of the second region $M_R$ for sequential storage of the right-channel main data blocks $D_{MR1}$–$D_{MR5}$. It is understood that the third region $M_C$ stores a table indicating the addresses $A_1$, $A_2$, $A_3$, ... of the left-channel main data blocks $D_{ML1}$, $D_{ML2}$, $D_{ML3}$, ..., and a table indicating the addresses $B_1$, $B_2$, $B_3$, ... of the right-channel main data blocks $D_{MR1}$, $D_{MR2}$, $D_{MR3}$, .... Of course, as the left- and right-channel main data blocks are renewed on the regions $M_L$ and $M_R$, so are the control data on the region $M_C$.

Figure 9:
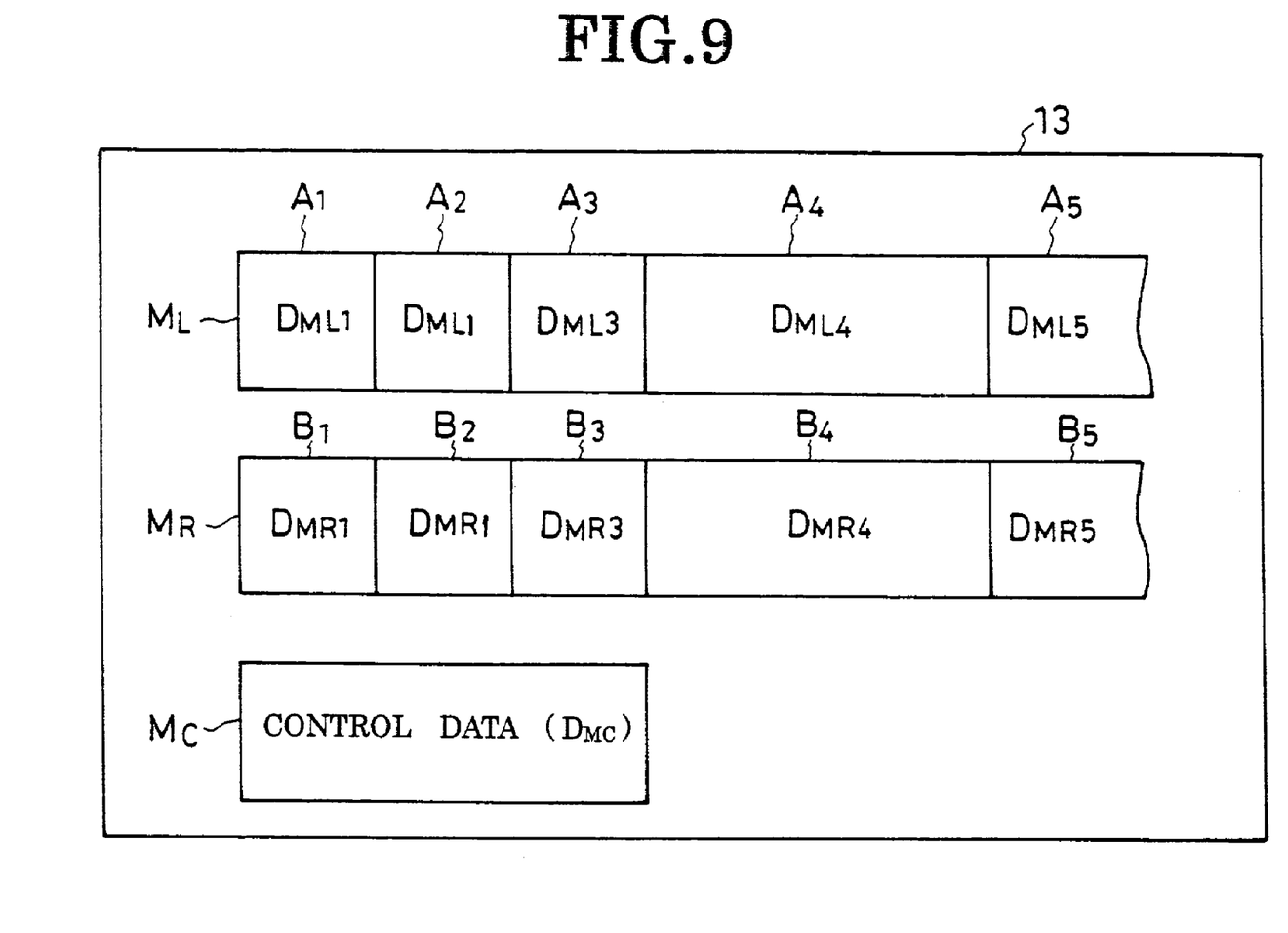
FIG. 9 is a diagram similar to FIG. 7 but explanatory of how the stored main audio data is edited block by block.

A reference back to FIG. 1 will reveal that the memory 13 has a data editor 14 connected thereto for block-by-block rewriting or editing of the two channels of MP3-encoded main data blocks on the regions $M_L$ and $M_R$ of the memory. Since all the blocks of the two channels of main data, $D_{ML1}$, $D_{ML2}$, $D_{ML3}$, ... and $D_{MR1}$, $D_{MR2}$, $D_{MR3}$, ..., are individually addressable, any desired ones of such blocks are rewritable. Thus the second main data blocks $D_{ML2}$ and $D_{MR2}$ of both channels, shown in the second storage locations $A_2$ and $B_2$ of the regions $M_L$ and $M_R$ in FIG. 7, are both shown replaced by the main data blocks $D_{ML1}$ and $D_{MR1}$ in FIG. 9 by way of example.

The memory 13 is also connected by way of signal paths $15_a$, $15_b$ and $15_c$ to an MP3 decoder adapter 16 whereby the two channels of main data blocks $D_{ML}$ and $D_{MR}$, which have been stored on the memory 13 as indicated in FIG. 7, are reformatted and adapted for subsequent decoding by a universal MP3 decoder.

Figure 3:
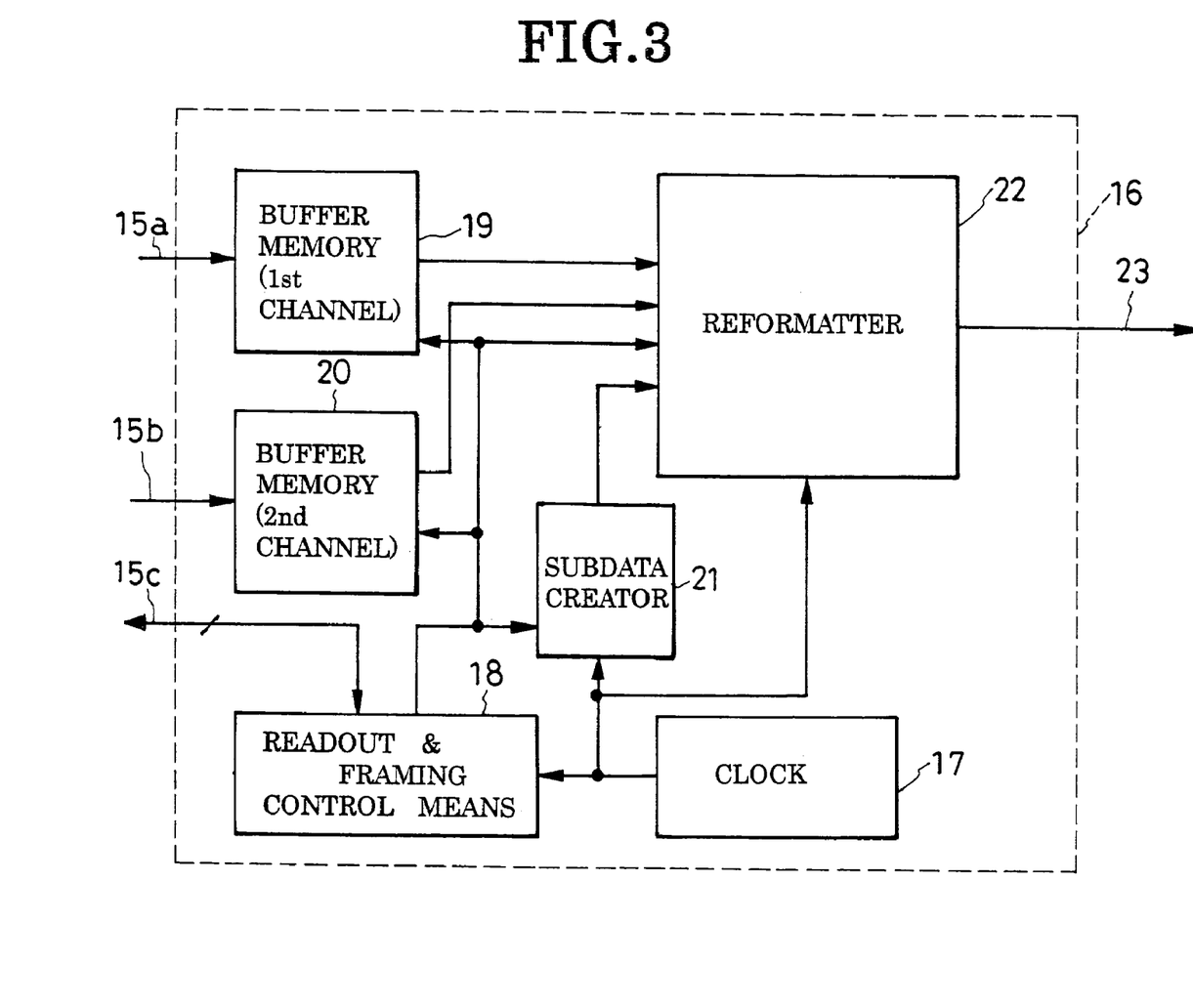
FIG. 3 is a block diagram of the decoder adapter included in the FIG. 1 recorder/player.

Reference may be had to FIG. 3 for more detailed study of the MP3 decoder adapter 16. This adapter includes readout and framing control means 18 having an input/output port coupled to the memory 13 by way of a bus $15_c$, and an input connected to a clock 17. Relying upon the control data $D_{MC}$ from the memory 13 as well as the clock pulses from the clock 17, the readout and framing control means 18 causes both channels of main data blocks $D_{ML1}$, $D_{ML2}$, $D_{ML3}$, ... and $D_{MR1}$, $D_{MR2}$, $D_{MR3}$, ... to be sequentially read out from the memory.

The MP3 decoder adapter 16 also includes two buffer memories 19 and 20 having inputs connected to the memory 7 by way of signal paths $15_a$ and $15_b$ for temporarily storing the respective channels of main data blocks $D_{ML1}$, $D_{ML2}$, $D_{ML2}$, ... and $D_{MR1}$, $D_{MR2}$, $D_{MR3}$, ... as they are read out under the direction of the readout and framing control means 18. Both buffer memories 19 and 20 have additional inputs connected to the readout and framing control means 18 in order to have the readout of the main data blocks $D_{ML1}$, $D_{ML2}$, $D_{ML2}$, ... and $D_{MR1}$, $D_{MR2}$, $D_{MR3}$, ... controlled thereby.

A subdata creator 21, another component of the MP3 decoder adapter 16, has inputs connected to the clock 17 and readout and framing control means 18 for creating subdata analogous with that on the subdata section $D_{sub}$, shown at (B) in FIG. 5, in each frame of the MP3 data stream. The whole MP3 frame subdata need not be created, however: The minimum requirements are header information including synchronization and channel-identification data.

Also included in the MP3 decoder adapter 16 is a data reformatter 22 having inputs connected to all of the clock 17, readout and framing control means 18, buffer memories 19 and 20, and subdata creator 21, and an output connected by way of a signal path 23 to an MP3 decoder 24, FIG. 1. The data reformatter 22 produces the reformatted MP3 data stream shown in FIG. 8, for delivery to the MP3 decoder 24.

Figure 8:
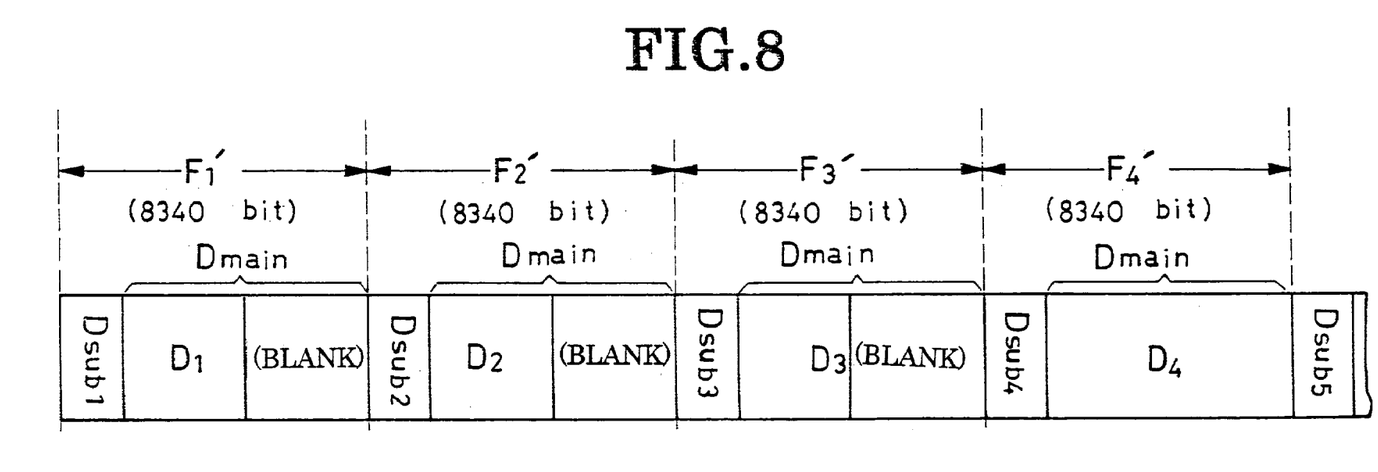
FIG. 8 is a diagram explanatory of how the audio data blocks are arranged in the reformatted data stream produced by the decoder adapter included in the FIG. 1 recorder/player.

A comparison of FIGS. 6 and 8 will make clear the differences between the original MP3 data stream produced by the MP3 encoder 6, FIG. 1, and the reformatted MP3 data stream produced by the decoder adapter 16. It will be noted first of all that the frames $F_1'$, $F_2'$, $F_3'$, ... of the reformatted MP3 data stream have each a greater bit number (e.g. 8340 bits) than that (e.g. 3336) of the original MP3 data stream. Further the main data blocks $D_1$, $D_2$, $D_3$, ... are arranged one in each of the reformatted frames $F_1'$, $F_2'$, $F_3'$, ...

Referring more specifically to FIG. 8, the reformatted frames $F_1'$, $F_2'$, $F_3'$, ... are each shown constituted of subdata sections $D_{sub1}$, $D_{sub2}$, $D_{sub3}$, ... of the same bit number as that of their counterparts in the FIG. 6 original MP3 data stream, and main data sections $D_{main}$ of a greater bit number than that of their FIG. 6 counterparts. Being each intended to accommodate one whole main data block, the main data sections $D_{main}$ of the reformatted frames $F_1'$, $F_2'$, $F_3'$, ... must have a bit number that is not less than the maximum possible bit number of the main data blocks $D_1$, $D_2$, $D_3$, .... Stated conversely, the MP3 encoder 6, FIG. 1, is designed to create main data blocks with a maximum possible bit number such that each such block can be wholly contained in the main data section $D_{main}$ of one of the reformatted frames $F_1'$, $F_2'$, $F_3'$.

In creating the reformatted MP3 data stream by the decoder adapter 16, shown in detail in FIG. 3, the subdata creator 21 puts out the required synchronization and other subdata at constant time spacings. The subdata is arranged in the subdata section $D_{sub1}$, $D_{sub2}$, $D_{sub3}$, ... of the FIG. 8 reformatted MP3 data stream in alternating relationship to the main data sections $D_{main}$ where the main data blocks $D_1$, $D_2$, $D_3$, ... are disposed. The first main data block $D_1$ is equivalent to the combination of both channels of first main data blocks $D_{ML1}$ and $D_{MR1}$ of FIG. 7; the second main data block $D_2$ to the combination of both channels of the second main data blocks $D_{ML2}$ and $D_{MR2}$; the third main data block $D_3$ to the combination of both channels of the third main data blocks $D_{ML3}$ and $D_{MR3}$; and so forth.

Sequentially read out from the memory 13, FIG. 1, the two channels of main data blocks $D_{ML1}$, $D_{ML2}$, $D_{ML2}$, ... and $D_{MR1}$, $D_{MR2}$, $D_{MR3}$, ... are directed through the respective buffer memories 19 and 20 into the data reformatter 22, to which there is also supplied the subdata from the subdata creator 21. The two channels of main data blocks $D_{ML1}$, $D_{ML2}$, $D_{ML2}$, ... and $D_{MR1}$, $D_{MR2}$, $D_{MR3}$, ... are combined block by block into the main data blocks $D_1$, $D_2$, $D_3$, .... These main data blocks are successively put out from the data reformatter 22, one in each main data section $D_{main}$, FIG. 8, of the reformatted MP3 main data stream and in alternating relationship to the subdata in each subdata section $D_{sub}$.

In FIG. 8 the first three main data blocks $D_1$, $D_2$ and $D_3$ are all shown to be less in bit number than each main data section $D_{main}$, leaving blanks in the first three main data sections. The fourth main data block $D_4$ is shown to be of the maximum possible bit number, filling up the fourth main data section.

The reformatted MP3 data stream is sent from the data reformatter 22, FIG. 3, to the decoder 24, FIG. 1, over the path 23 at the maximum bit rate of 320 kbps. The decoder 24 is per se of conventional design capable of decoding the reformatted MP3 data stream into the stereophonic analog audio signals, for delivery to the next processing station via the pair of output terminals 3 and 4. Despite the editing performed thereon by the editor 14 while they were stored on the memory 13, the outgoing analog audio signals are faithful replicas of the input signals.

Figure 10:
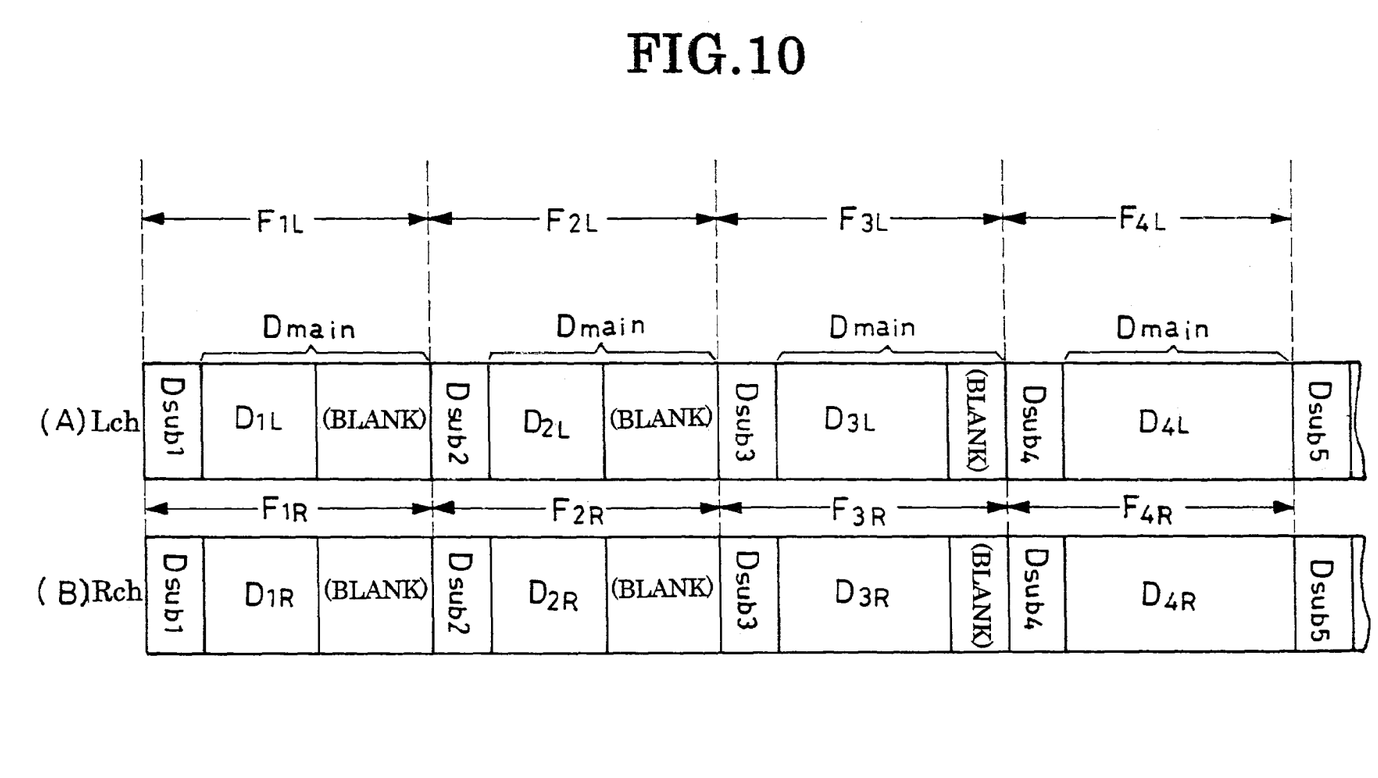
FIG. 10, consisting of (A) and (B), is a series of diagrams showing two separate channels of audio data streams that may be alternatively retrieved from the memory of the FIG. 1 recorder player.

Despite the foregoing detailed disclosure, it is not desired that the present invention be limited by the exact showing of the drawings or the description thereof. The following is a brief list of possible modifications, alterations and adaptations of the illustrated embodiment which are all believed to fall within the scope of this invention:

1. The two channels of data blocks $D_{ML}$ and $D_{MR}$ issuing from the memory 13 could be reformatted into two separate MP3 data streams $L_{ch}$ and $R_{ch}$, as indicated at (A) and (B) in FIG. 10, instead of into the combined MP3 data stream of FIG. 8. The main data in the left-channel frames $F_{1L}$, $F_{2L}$, $F_{3L}$, . . . and that in the right-channel frames $F_{1R}$, $F_{2R}$, $F_{3R}$, . . . would then be equivalent respectively to that shown at (C) and (D) in FIG. 4.

2. The MP3 encoder 6 could be adapted for production of single-channel data streams instead of the two-channel data stream shown in FIGS. 5 and 6. The single-channel data streams might then be written on the memory 13 so as to permit editing.

3. The invention could be applied to the recording and playback of not just stereophonic, but multichannel, audio signals.

4. The memory 13 could take a by a variety of other editable data storage devices other than the exemplified flash memory, such as other types of semiconductor memories as well as magnetic, optical, and magneto-optic storages.

5. An MP3 data reproducer or transfer device could be employed in lieu of the MP3 encoder 6.

6. A WAVE data generator could be connected in place of the ADC 5.

7. The main data blocks on the main data sections $D_{main}$ of the MP3-encoded data stream could each be an aggregate of fixed-length words, with the number of words or samples of each data block varied according to the probability of appearance, or importance, instead of varying the bits of the main data blocks by the variable-word-length code.

8. The multichannel inputs to, and outputs from, the memory 13 could be both sent over a single path by time-division multiplexing.

9. Either of the uncompressed data streams of FIGS. 8 and 10 could be formed on a preceding stage of the memory 13 and subsequently stored on this memory for editing.

What is claimed is:

1. A data processing method designed to permit editing of compressed data, comprising the steps of:
 (a) transferring main data in the form of a compressed data stream having a series of fixed-bit-number frames each having a main data section and a subdata section, the main data sections being closely packed with variable-bit-number blocks of the main data, with each main data block contained in at least one main data section and possibly spanning the main data sections of a plurality of consecutive frames, each of the subdata sections holding subdata indicative of the beginning positions of the respective main data blocks with respect to the frames;
 (b) creating, on the basis of the subdata on the subdata sections of the compressed data stream, control data indicative of the addresses of expected storage locations on a rewritable storage device where the main data blocks on the main data sections of the compressed data stream are to be stored;
 (c) storing the main data blocks in the expected storage locations on the rewritable storage device; the expected storage locations being divided from each other and having different addresses;
 (d) storing the control data to permit the main data blocks on the rewritable storage device to be individually addressed for editing;
 (e) reading out the main data blocks from the rewritable storage device; and
 (f) reformatting the main data blocks into a decodable data stream, the decodable data stream having a series of fixed-bit-number frames each having a main data section and a subdata section, the main data sections being such in bit number that the main data blocks are each wholly contained in one main data section.

2. The data processing method of claim 1 wherein the subdata sections of the decodable data stream hold synchronization data.

3. A method of digitally recording audio signals, with a capability of editing the digitally recorded audio signals, comprising the steps of:
 (a) providing at least two channels of digital audio signals;
 (b) encoding the digital audio signals into the form of a compressed data stream having a series of fixed-bit-number frames each having a main data section and a subdata section, the main data sections being closely packed with variable-bit-number blocks of audio data, with each audio data block contained in at least one main data section and possibly spanning the main data sections of a plurality of consecutive frames, each of the subdata sections holding subdata indicative of the beginning positions of the respective audio data blocks with respect to the frames;
 (c) separating the audio data blocks of the compressed data stream into the original two channels of audio data blocks;
 (d) creating, on the basis of the subdata on the subdata sections of the compressed data stream, control data indicative of the addresses of expected storage locations on a rewritable storage device where the two channels of audio data blocks are to be stored;
 (e) storing the two channels of audio data blocks in the expected storage locations on the rewritable storage device; the expected storage locations being divided from each other and having different addresses;
 (f) storing the control data to permit the two channels of audio data blocks on the rewritable storage device to be individually addressed for editing;
 (g) reading out the two channels of audio data blocks from the rewritable storage device; and
 (h) reformatting the two channels of audio data blocks into a decodable data stream, the decodable data stream having a series of fixed-bit-number frames each having a main data section and a subdata section, the main data sections being such in bit number that the main data blocks are each wholly contained in one main data section.

4. The digitally recording method of claim 3 wherein the subdata sections of the decodable data stream hold synchronization data.

5. A data processing system designed to permit editing of compressed data, comprising:
(a) means for transferring main data in the form of a compressed data stream having a series of fixed-bit-number frames each having a main data section and a subdata section, the main data sections being closely packed with variable-bit-number blocks of the main data, with each main data block contained in at least one main data section and possibly spanning the main data sections of a plurality of consecutive frames, each of the subdata sections holding subdata indicative of the beginning positions of the respective main data blocks with respect to the frames;
(b) a control data creator for creating, on the basis of the subdata on the subdata sections of the compressed data stream, control data indicative of the addresses of expected storage locations on a rewritable storage device where the main data blocks on the main data sections of the compressed data stream are to be stored;
(c) a rewritable storage device coupled to the transferring means and the control data creator for storing the main data blocks from the compressed data stream in the expected storage locations thereon, together with the control data to permit the main data blocks to be individually addressed for editing, the expected storage locations being divided from each other and having different addresses;
(d) a readout controller coupled to the rewritable storage device for causing the main data blocks to be sequentially read out therefrom; and
(e) a reformatter coupled to the rewritable storage device and the readout controller for reformatting the retrieved main data blocks into a decodable data stream, the decodable data stream having a series of fixed-bit-number frames each having a main data section and a subdata section, the main data sections being such in bit number that the main data blocks are each wholly contained in one main data section.

6. The data processing system of claim 5 further comprising a data editor coupled to the rewritable storage device for block-by-block editing of the stored main data blocks.

7. The data processing system of claim 5 further comprising a decoder coupled to the reformatter for decoding the decodable data stream.

8. The data processing system of claim 5 wherein the rewritable storage device is a flash memory.

9. A system for digitally recording audio signals, with a capability of editing the digitally recorded audio signals, comprising:
(a) an analog-to-digital converter for digitizing at least two channels of analog audio signals;
(b) an encoder for encoding the digital audio signals into the form of a compressed data stream having a series of fixed-bit-number length frames each having a main data section and a subdata section, the main data sections being closely packed with variable-bit-number blocks of audio data, with each audio data block contained in at least one main data section and possibly spanning the main data sections of a plurality of consecutive frames, each of the subdata sections holding subdata indicative of the beginning positions of the respective audio data blocks with respect to the frames;
(c) a channel separator for separating the audio data blocks of the compressed data stream into the original two channels of audio data blocks;
(d) a control data creator for creating, on the basis of the subdata on the subdata sections of the compressed data stream, control data indicative of the addresses of expected storage locations on a rewritable storage device where the two channels of audio data blocks are to be stored;
(e) a rewritable storage device coupled to the channel separator and the control data creator for storing the two channels of audio data blocks in the expected storage locations thereon, together with the control data to permit the two channels of audio data blocks to be individually addressed for editing, the expected storage locations being divided from each other and having different addresses;
(f) a readout controller coupled to the rewritable storage device for causing the two channels of audio data blocks to be sequentially read out therefrom; and
(g) a reformatter coupled to the rewritable storage device and the readout controller for reformatting the retrieved two channels of audio data blocks into a decodable data stream, the decodable data stream having a series of fixed-bit-number frames each having a main data section and a subdata section, the main data sections being such in bit number that the main data blocks are each wholly contained in one main data section.

10. The digitally recoding system of claim 9 further comprising a data editor coupled to the rewritable storage device for block-by-block editing of the audio data blocks stored thereon.

11. The digitally recording system of claim 9 further comprising a decoder coupled to the reformatter for decoding the decodable data stream into the original two channels of audio signals.

* * * * *